United States Patent
Itahashi et al.

(10) Patent No.: US 9,608,033 B2
(45) Date of Patent: Mar. 28, 2017

(54) SOLID-STATE IMAGE SENSOR, METHOD OF MANUFACTURING THE SAME, AND CAMERA

(71) Applicant: CANON KABUSHIKI KAISHA, Tokyo (JP)

(72) Inventors: Masatsugu Itahashi, Yokohama (JP); Seiichi Tamura, Yokohama (JP); Nobuaki Kakinuma, Tokyo (JP); Mineo Shimotsusa, Machida (JP); Masato Fujita, Kitakyushu (JP); Yusuke Onuki, Fujisawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 183 days.

(21) Appl. No.: 14/691,733

(22) Filed: Apr. 21, 2015

(65) Prior Publication Data

US 2015/0325620 A1 Nov. 12, 2015

(30) Foreign Application Priority Data

May 12, 2014 (JP) .................................. 2014-098891

(51) Int. Cl.
*H04N 5/335* (2011.01)
*H01L 27/146* (2006.01)
*H01L 27/148* (2006.01)
*H04N 5/374* (2011.01)

(52) U.S. Cl.
CPC .... *H01L 27/14689* (2013.01); *H01L 27/1461* (2013.01); *H01L 27/1462* (2013.01); *H01L 27/1463* (2013.01); *H01L 27/14614* (2013.01); *H01L 27/14616* (2013.01); *H01L 27/14812* (2013.01); *H04N 5/374* (2013.01)

(58) Field of Classification Search
None
See application file for complete search history.

(56) References Cited

U.S. PATENT DOCUMENTS

| | | | |
|---|---|---|---|
| 7,411,170 B2 | 8/2008 | Shimotsusa et al. | |
| 7,592,578 B2 | 9/2009 | Shimotsusa et al. | |
| 8,115,154 B2 | 2/2012 | Matsumoto et al. | |
| 8,431,880 B2 | 4/2013 | Matsumoto et al. | |
| 8,518,771 B2 | 8/2013 | Kimizuka et al. | |
| 8,525,909 B2 | 9/2013 | Matsumoto et al. | |

(Continued)

FOREIGN PATENT DOCUMENTS

| | | |
|---|---|---|
| JP | 2009-026848 A | 2/2009 |
| JP | 2010-056515 A | 3/2010 |

(Continued)

*Primary Examiner* — Stephen Coleman
(74) *Attorney, Agent, or Firm* — Fitzpatrick, Cella, Harper & Scinto

(57) ABSTRACT

A solid-state image sensor includes a pixel area and a peripheral circuit area. The pixel area includes a first MOS, and the peripheral circuit area includes a second MOS. A method includes forming a gate of the first MOS and a gate of the second MOS, forming a first insulating film to cover the gates of the first and second MOSs, etching the first insulating film in the peripheral circuit area in a state that the pixel area is masked to form a side spacer on a side face of the gate of the second MOS, etching the first insulating film in the pixel area in a state that the peripheral circuit area is masked, and forming the second insulating film to cover the gates of the first and second MOSs and the side spacers.

20 Claims, 6 Drawing Sheets

(56) References Cited

U.S. PATENT DOCUMENTS

| | | |
|---|---|---|
| 8,546,173 B2 | 10/2013 | Itahashi |
| 8,716,055 B2 | 5/2014 | Itahashi |
| 8,723,239 B2 | 5/2014 | Doi et al. |
| 8,730,361 B2 | 5/2014 | Itahashi |
| 8,953,077 B2 | 2/2015 | Matsumoto et al. |
| 8,962,372 B2 | 2/2015 | Itahashi |
| 2013/0089963 A1 | 4/2013 | Mishima et al. |
| 2013/0183786 A1 | 7/2013 | Itahashi et al. |
| 2013/0285131 A1 | 10/2013 | Matsumoto et al. |
| 2014/0001522 A1 | 1/2014 | Kimizuka et al. |
| 2015/0147843 A1 | 5/2015 | Onuki et al. |

FOREIGN PATENT DOCUMENTS

| | | |
|---|---|---|
| JP | 2010-056516 A | 3/2010 |
| JP | 2010-212536 A | 9/2010 |
| JP | 2011-243747 A | 12/2011 |
| JP | 2013-021352 A | 1/2013 |
| JP | 2013-084740 A | 5/2013 |

SOLID-STATE IMAGE SENSOR, METHOD OF MANUFACTURING THE SAME, AND CAMERA

BACKGROUND OF THE INVENTION

Field of the Invention

The present invention relates to a solid-state image sensor, a method of manufacturing the same, and a camera.

Description of the Related Art

Japanese Patent Laid-Open No. 2009-26848 describes a solid-state image sensor which includes a sensor area (pixel area) forming a pixel portion and a MOS transistor area (peripheral circuit area) forming a CMOS logic circuit portion, and a method of manufacturing the same. This manufacturing method includes a step of forming a silicon oxide film and a silicon nitride film in order on a substrate where gate electrodes have been formed, and a step of etching the silicon oxide film and the silicon nitride film. With this etching, side wall spacers are formed simultaneously on the side faces of the gate electrodes in both the sensor area and the MOS transistor area. Japanese Patent Laid-Open No. 2011-243747 describes a photoelectric conversion device which includes a pixel area and a peripheral circuit area. This photoelectric conversion device includes side spacers on the side faces of the gate electrodes in both the pixel area and the peripheral circuit area. Note that the words "side wall spacer" and "side spacer" are synonymous.

In the method described in Japanese Patent Laid-Open No. 2009-26848, the silicon oxide film and the silicon nitride film are formed in the sensor area and the MOS transistor area, and then the silicon oxide film and the silicon nitride film in the sensor area and the MOS transistor area are etched simultaneously. Therefore, in the method described in Japanese Patent Laid-Open No. 2009-26848, the side wall spacer formed in the sensor area (pixel area) and the side wall spacer formed in the MOS transistor area (peripheral circuit area) have the same shape. In a method of etching an insulating film in the sensor area and an insulting film in the MOS transistor area simultaneously, it may be difficult to optimize components in the sensor area (pixel area) and components in the MOS transistor area (peripheral circuit area) separately. Note that the components can be, for example, photoelectric converters, light transmission units positioned on the photoelectric converters, MOS transistors, and the like. Furthermore, optimization of the components can include, in addition to optimization of the characteristics of the components, facilitation of a step of forming the components or the like.

Japanese Patent Laid-Open No. 2011-243747 does not specifically disclose what kind of a procedure is used to manufacture the side spacer in the pixel area and the side spacer in the peripheral circuit area.

SUMMARY OF THE INVENTION

The present invention provides a technique advantageous in optimizing components in a pixel area and components in a peripheral circuit area.

One of aspects of the present invention provides a method of manufacturing a solid-state image sensor which includes a pixel area where a plurality of pixels are arrayed and a peripheral circuit area where a circuit configured to read out a signal from the pixel area is arranged, the pixel area including a first MOS transistor, and the peripheral circuit area including a second MOS transistor, the method comprising: a step of forming a gate electrode of the first MOS transistor and a gate electrode of the second MOS transistor on a semiconductor substrate; a step of forming a first insulating film to cover the semiconductor substrate on which the gate electrode of the first MOS transistor and the gate electrode of the second MOS transistor have been formed; a first etching step of etching the first insulating film in the peripheral circuit area in a state in which the pixel area is masked so as to form a side spacer on a side face of the gate electrode of the second MOS transistor from a part of the first insulating film; a second etching step of etching the first insulating film in the pixel area in a state in which the peripheral circuit area is masked; and a step of forming, after the first etching step and the second etching step, the second insulating film to cover the semiconductor substrate on which the gate electrode of the first MOS transistor, the gate electrode of the second MOS transistor, and the side spacers have been formed.

Further features of the present invention will become apparent from the following description of exemplary embodiments with reference to the attached drawings.

DESCRIPTION OF THE EMBODIMENTS

The present invention will be described below with reference to the accompanying drawings by way of exemplary embodiments.

A solid-state image sensor of the present invention includes a pixel area. The pixel area includes photoelectric converters and at least one first MOS transistor. The first MOS transistor can include, for example, a transfer MOS transistor which transfers charges generated in the photoelectric converter to a floating diffusion (charge-voltage converter).

In another aspect, the pixel area typically includes a plurality of pixels arrayed one-dimensionally or two-dimensionally. Each pixel includes the photoelectric converter and at least one first MOS transistor. At least one first MOS transistor of each pixel can include a transfer MOS transistor. At least one first MOS transistor of each pixel can also include an amplification MOS transistor configured to read out a signal corresponding to charges transferred to the floating diffusion. The plurality of pixels may share the amplification MOS transistor. At least one first MOS transistor of each pixel can further include a reset MOS transistor which resets the potential of the floating diffusion. The plurality of pixels may also share the reset MOS transistor.

Figure 1A:
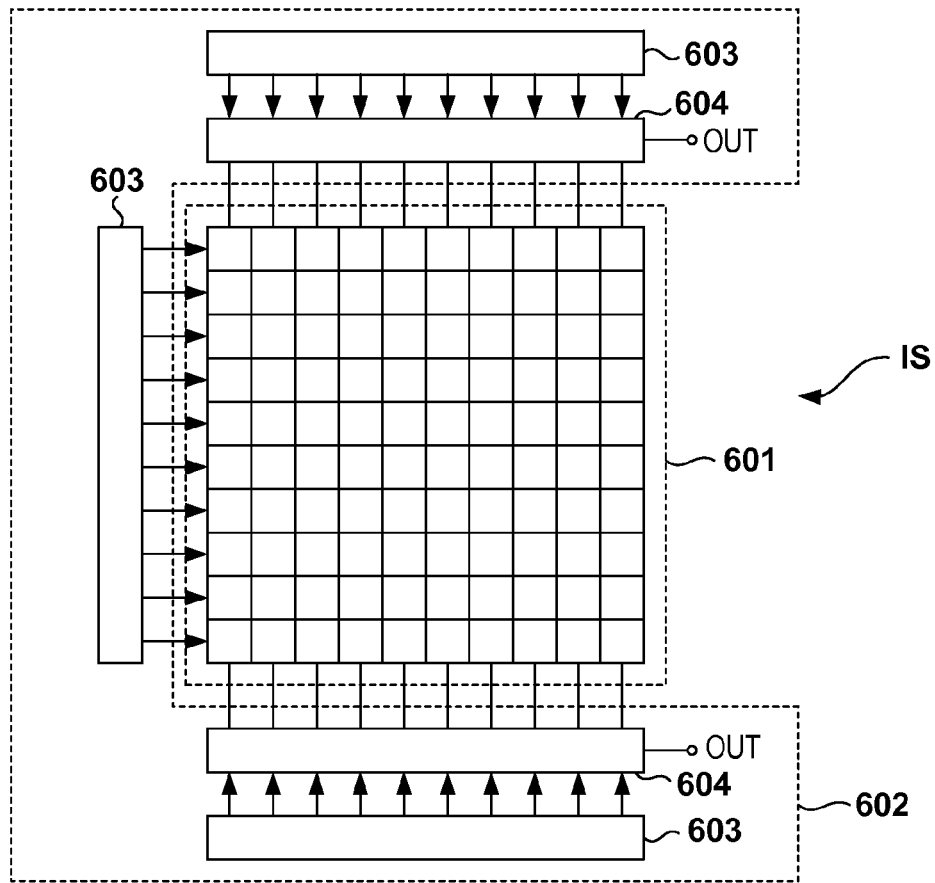
FIGS. 1A and 1B are views showing an example of the arrangement of a solid-state image sensor according to an embodiment of the present invention.
Figure 1B:
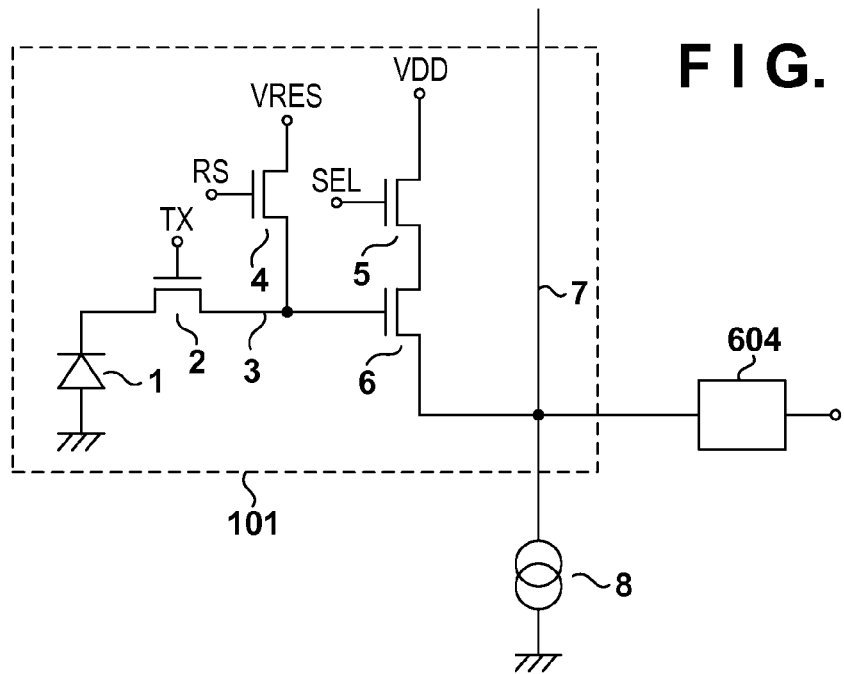

An example of the arrangement of a solid-state image sensor IS according to an embodiment of the present invention will be described with reference to FIGS. 1A and 1B. The solid-state image sensor IS includes a pixel area 601 including a plurality of pixels 101 and a peripheral circuit area 602. The pixel area 601 can include a one-dimensional or two-dimensional array of the plurality of pixels 101. The peripheral circuit area 602 includes a plurality of second MOS transistors. In another aspect, the peripheral circuit area 602 can include a scanning circuit 603 which selects the pixels 101 in the pixel area 601 and a processing circuit (readout circuit) 604 which processes a signal output from the selected pixel 101. Further, the peripheral circuit area 602 can include an AD conversion circuit when AD conversion is performed in the solid-state image sensor IS.

Each pixel 101 includes a photoelectric converter 1 and a transfer MOS transistor 2 serving as at least one first MOS transistor. In an example shown in FIG. 1B, the pixel 101 further includes, as other first MOS transistors, a reset MOS transistor 4 and an amplification MOS transistor 6. The photoelectric converter 1 is, for example, a photodiode and converts incoming light into charges. The transfer MOS transistor 2 transfers the charges generated in the photoelectric converter 1 to a floating diffusion 3. The potential of the floating diffusion 3 changes by transferring the charges to the floating diffusion 3. That is, the floating diffusion 3 functions as a charge-voltage converter. The gate electrode of the amplification MOS transistor 6 is electrically connected to the floating diffusion 3. The amplification MOS transistor 6 outputs, to a column signal line 7, a signal corresponding to a change in the potential of the floating diffusion 3.

A source-follower circuit serving as an amplification circuit can be formed by a power supply (power supply line) VDD, the amplification MOS transistor 6, the column signal line 7, and a constant current source 8. The constant current source 8 can be arranged in the pixel area or the peripheral circuit area. A selection MOS transistor 5 is arranged between the power supply line VDD and the amplification MOS transistor 6 or between the amplification MOS transistor 6 and the column signal line 7 and turned on, thereby selecting the pixel 101 to which it belongs. The pixel may be selected by controlling the reset potential of the floating diffusion by the reset MOS transistor 4 without using the selection MOS transistor 5. The signal output to the column signal line 7 (that is, the signal of the pixel 101) can be read out by the processing circuit (readout circuit) 604.

Figure 2:
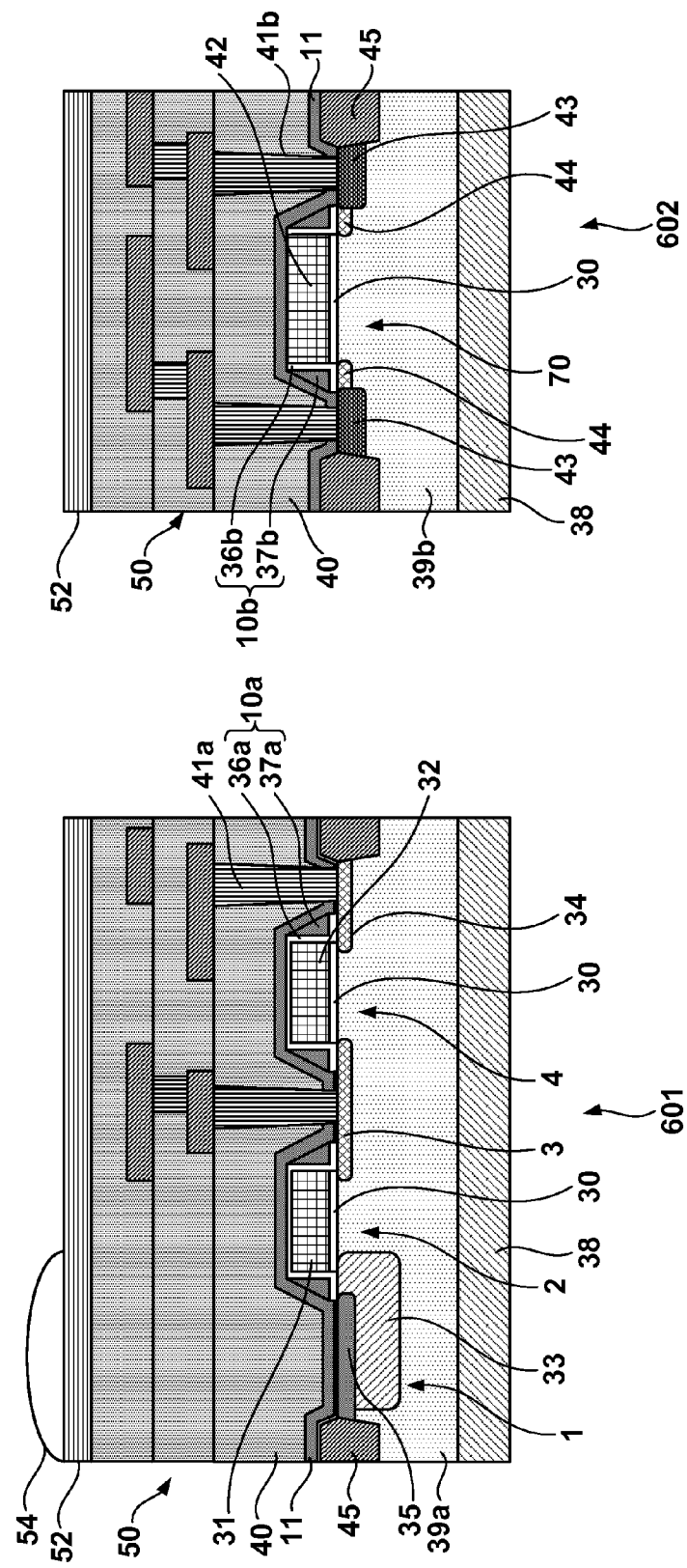
FIG. 2 shows schematic sectional views of the arrangements of a portion of a pixel area and a portion of a peripheral circuit area according to the first embodiment.

FIG. 2 shows schematic sectional views of a portion of the pixel area 601 and a portion of the peripheral circuit area 602 in the solid-state image sensor IS according to the first embodiment. First, the structure of the pixel area 601 will be described. FIG. 2 shows, as the components in the pixel area 601, the photoelectric converter 1, the transfer MOS transistor 2, and the reset MOS transistor 4. The photoelectric converter 1 includes, as a charge accumulation region, a semiconductor region 33 of the first conductivity type.

The first conductivity type is a conductivity type which regards charges handled as a signal as a majority carrier. In this embodiment, the first conductivity type is an n type by which the charges handled as the signal are electrons. On the contrary, when the charges handled as the signal are holes, the first conductivity type is a p type. The semiconductor region 33 of the first conductivity type is arranged in a well 39a serving as a semiconductor region of the second conductivity type opposite to the first conductivity type. A photodiode serving as the photoelectric converter 1 is formed by the semiconductor region 33 and the well 39a.

The photoelectric converter 1 may include a semiconductor region 35 of the second conductivity type on the semiconductor region 33 of the first conductivity type. By providing the semiconductor region 35, the photoelectric converter 1 has a buried structure. The well 39a can be arranged on a semiconductor region 38 of the first conductivity type. The well 39a and the semiconductor region 38 serving as elements forming a portion lower than gate insulating films 30 form a semiconductor substrate.

The floating diffusion 3 is formed by the semiconductor region of the first conductivity type. The transfer MOS transistor 2 includes the gate insulating film 30 and a gate electrode 31. One of two main electrodes of the transfer MOS transistor 2 is the semiconductor region 33 serving as the charge accumulation region and the other main electrode is the semiconductor region of the first conductivity type serving as the floating diffusion. Note that the two main electrodes mean the source and drain. The reset MOS transistor 4 includes the gate insulating film 30 and a gate electrode 32. One of two main electrodes of the reset MOS transistor 4 is the floating diffusion 3 and the other main electrode is a semiconductor region 34 of the first conductivity type.

The gate electrodes 31 and 32 can be made of polysilicon. Side spacers 10a can be provided on the side faces of the gate electrodes 31 and 32. The side spacer 10a is provided on the side face on each side of the floating diffusion 3. The side spacer 10a is also provided on the side face of the gate electrode 31 on the side of the semiconductor region 33. Each side spacer 10a can be formed by, for example, a plurality of insulating layers 36a and 37a. In one example, the lower insulating layer 36a can be made of an oxide such as silicon oxide and each upper insulating layer 37a can be made of a nitride such as silicon nitride. Each side spacer 10a may be formed by a single layer. Each side spacer 10a may be used to form an LDD (Lightly Doped Drain) structure when forming the source and drain by ion implantation. In this embodiment, however, the source and drain of the first MOS transistor arranged in the pixel area 601 do not have the LDD structure but has a single drain structure made of a semiconductor region with a low impurity concentration.

An element isolation 45 configured to isolate the photoelectric converter 1 and the MOS transistors (the transfer MOS transistor 2, the reset MOS transistor 4, the amplification transistor 6, and the selection MOS transistor 5) from each other is arranged in the well 39a. The element isolation 45 can be, for example, an LOCOS-, an STI-, or a mesa-type. The element isolation 45 can be made of, for example, silicon oxide.

An insulating film 11 is arranged to cover the semiconductor substrate on which the gate electrodes 31 and 32 have been formed. The insulating film 11 is a dielectric film that can function as an antireflection film on the photoelectric converter 1. The insulating film 11 can be a nitride film such as a silicon nitride film or a silicon oxynitride film. The nitrogen concentration of the insulating film 11 serving as the nitride film can be 10 atm % or higher. The insulating film 11 can be used as an etching stopper in an etching step of forming contact holes for contact plugs 41a connected to the first MOS transistors such as the MOS transistors 2 and 4. The insulating film 11 can have a thickness within a range of 20 nm to 80 nm in order to satisfactorily exert its antireflection function and etching stopper function.

The insulating film 11 is arranged or formed without intervening the nitride film such as the silicon nitride film between the semiconductor substrate and the portion of the insulating film 11 along the surface of the semiconductor substrate. Alternatively, the insulating film 11 is arranged or formed without intervening the nitride film such as the silicon nitride film between the upper faces of the gate electrodes 31 and 32, and the portions of the insulating film 11 along the upper faces of the gate electrodes 31 and 32 in the pixel area 601. The portion of the insulating film 11 along the surface of the semiconductor substrate is, for example, a portion along the light receiving surface of the photoelectric converter 1 (semiconductor region 35) and a portion along the surface of each main electrode of each transistor. Note that the side spacers 10a containing silicon nitride are provided between the portion of the insulating film 11 along each side spacer 10a, and the gate electrode 31 or 32, or the semiconductor substrate. The nitride film which does not intervene between the insulating film 11, and the photoelectric converter 1 and/or the gate electrodes 31 and 32 has the nitrogen concentration of 10 atm % or higher. The nitrogen concentration of silicon nitride which matches, for example, a stoichiometric composition can exceed 50 atm %. An insulating film with the nitrogen concentration of 0 atm % (inclusive) to 10 atm % (exclusive) may intervene between the photoelectric converter 1 and/or the gate electrodes 31 and 32. In other words, the nitrogen concentration between the insulating film 11 and the photoelectric converter 1 and/or the gate electrodes 31 and 32 is less than 10 atm %, preferably less than 1.0 atm %. An insulating film having the low nitrogen concentration can be formed by plasma nitriding, thermal oxinitriding, ion implantation of nitrogen, or the like. The distance between the insulating film 11 and the surface of the semiconductor substrate is preferably 50 nm or less, more preferably 20 nm or less. Note that if the nitride film is arranged under the insulating film 11, the nitride film can also act as an etching stopper after etching an interlayer insulating film 40 using the insulating film 11 as the etching stopper. As a result, the number of steps can increase. In addition, if the nitride film is arranged under the insulating film 11, the thickness of a layer structure on the semiconductor substrate can increase and the sensitivity can decrease.

In this embodiment, the insulating layer 36a (for example, a silicon oxide layer) which is not the nitride film remains between the insulating film 11 and the semiconductor substrate and the gate electrodes 31 and 32. However, the insulating layer 36a is not indispensable. The insulating layer 36a can have the thickness of, for example, 20 nm or less so as not to impair the antireflection function on the photoelectric converter 1 and the etching stopper function when forming the contact hole for each first MOS transistor in the pixel area 601. In this embodiment, the insulating layers 37a (for example, the silicon nitride layers) which form the side spacers 10a do not exist on the gate electrodes 31 and 32 in the pixel area 601. This arrangement is advantageous in reducing steps in the entire pixel area 601.

The interlayer insulating film 40 is arranged on the insulating film 11. In the interlayer insulating film 40, the contact hole for each first MOS transistor in the pixel area 601 is formed and the contact plug 41a is arranged in each contact hole. A wiring structure 50 is arranged on the interlayer insulating film 40. The wiring structure 50 can include one or a plurality of interlayer insulating films and one or a plurality of wiring layers. For example, a color filter 52 and/or a microlens 54 can be arranged on the wiring structure 50.

Next, the structure of the peripheral circuit area 602 will be described. FIG. 2 shows an n-type MOS transistor 70 as one example of the second MOS transistor serving as a component in the peripheral circuit area 602. Note that FIG. 2 only shows the n-type MOS transistor 70 as the second MOS transistor. However, the second MOS transistor also includes a p-type MOS transistor.

The MOS transistor 70 includes the gate insulating film 30, a gate electrode 42, and two main electrodes (the source and drain). The gate electrode 42 can be formed simultaneously with the gate electrodes 31 and 32 in the pixel area 601. Each of the two main electrodes can have the LDD structure. That is, each main electrode can include a semiconductor region 43 of the first conductivity type containing an impurity of the first conductivity type at a high concentration and a semiconductor region 44 of the first conductivity type containing an impurity of the first conductivity type at a low concentration. Note that the impurity of the first conductivity type is implanted to form a semiconductor region of the first conductivity type in a well 39b where the main electrodes should be arranged.

A side spacer 10b can be provided in each side face of the gate electrode 42. Each side spacer 10b can be formed by a plurality of insulating layers 36b and 37b. The insulating layer 36b is deposited simultaneously with the insulating layer 36a and each insulating layer 37b is deposited simultaneously with each insulating layer 37a. In one example, the lower insulating layer 36b can be made of an oxide such as silicon oxide and each upper insulating layer 37b can be made of a nitride such as silicon nitride. Each side spacer 10b may be formed by a single layer. The above-described LDD structure can be formed by using the side spacers 10b.

The side spacers 10a provided in the pixel area 601 and the side spacers 10b provided in the peripheral circuit area 602 are formed by separate etching steps, and can have different structures (for example, different dimensions).

The aforementioned insulating film 11 is arranged to cover the semiconductor substrate on which the gate electrode 42 has been formed. The insulating film 11 can be used as an etching stopper in an etching step of forming contact holes for contact plugs 41b connected to the second MOS transistor such as the MOS transistor 70. Another insulating film may be arranged between the insulating film 11 and the semiconductor substrate. It is preferable, however, to limit the other insulating film to a thickness that will not lose the merit in using the insulating film 11 as the etching stopper.

Figure 3:
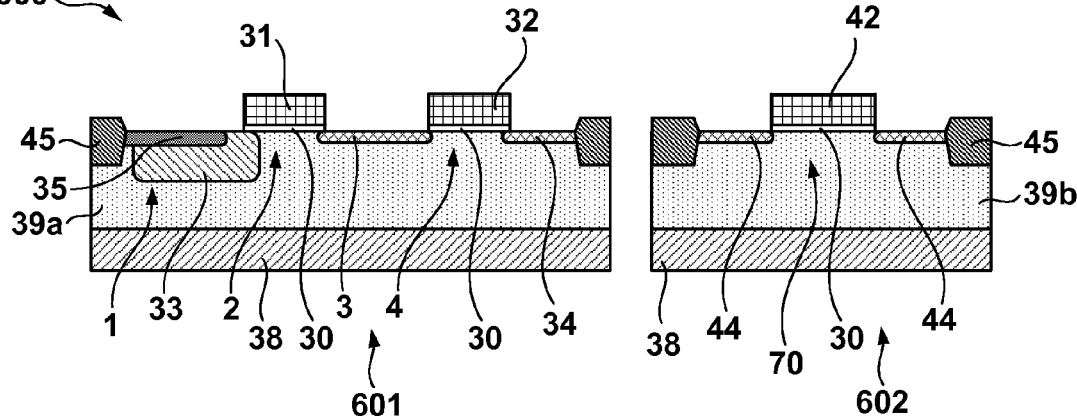
FIG. 3 shows schematic sectional views illustrating a method of manufacturing the solid-state image sensor in the order of steps according to the first embodiment.
Figure 3:
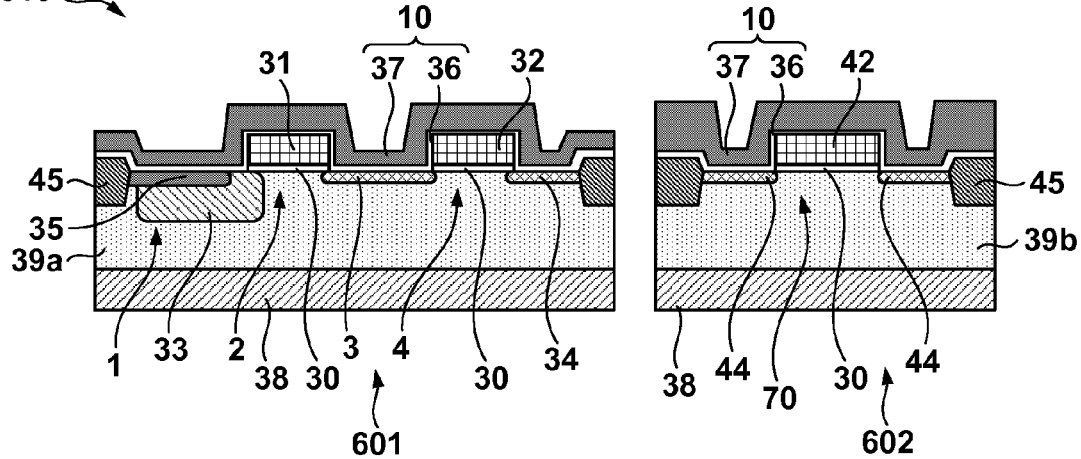
Figure 3:
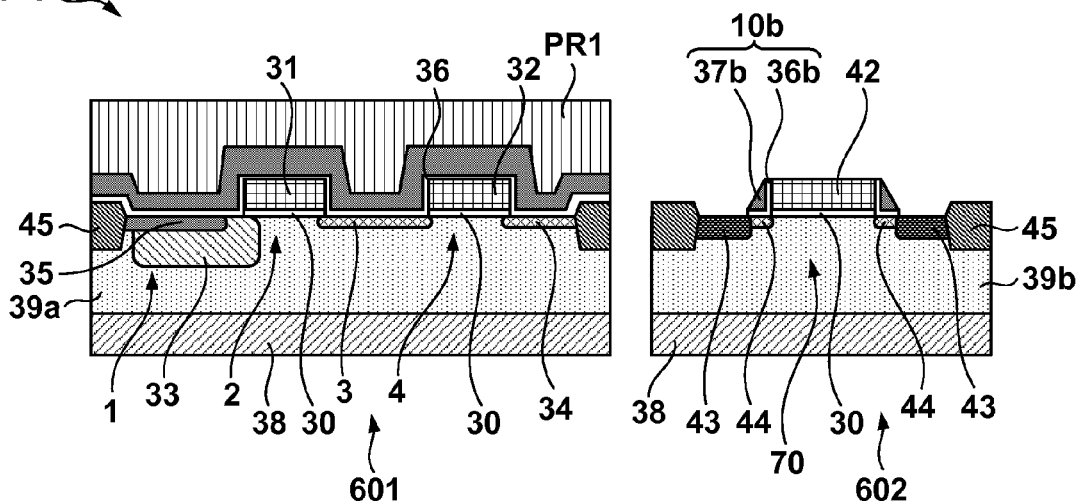
Figure 4:
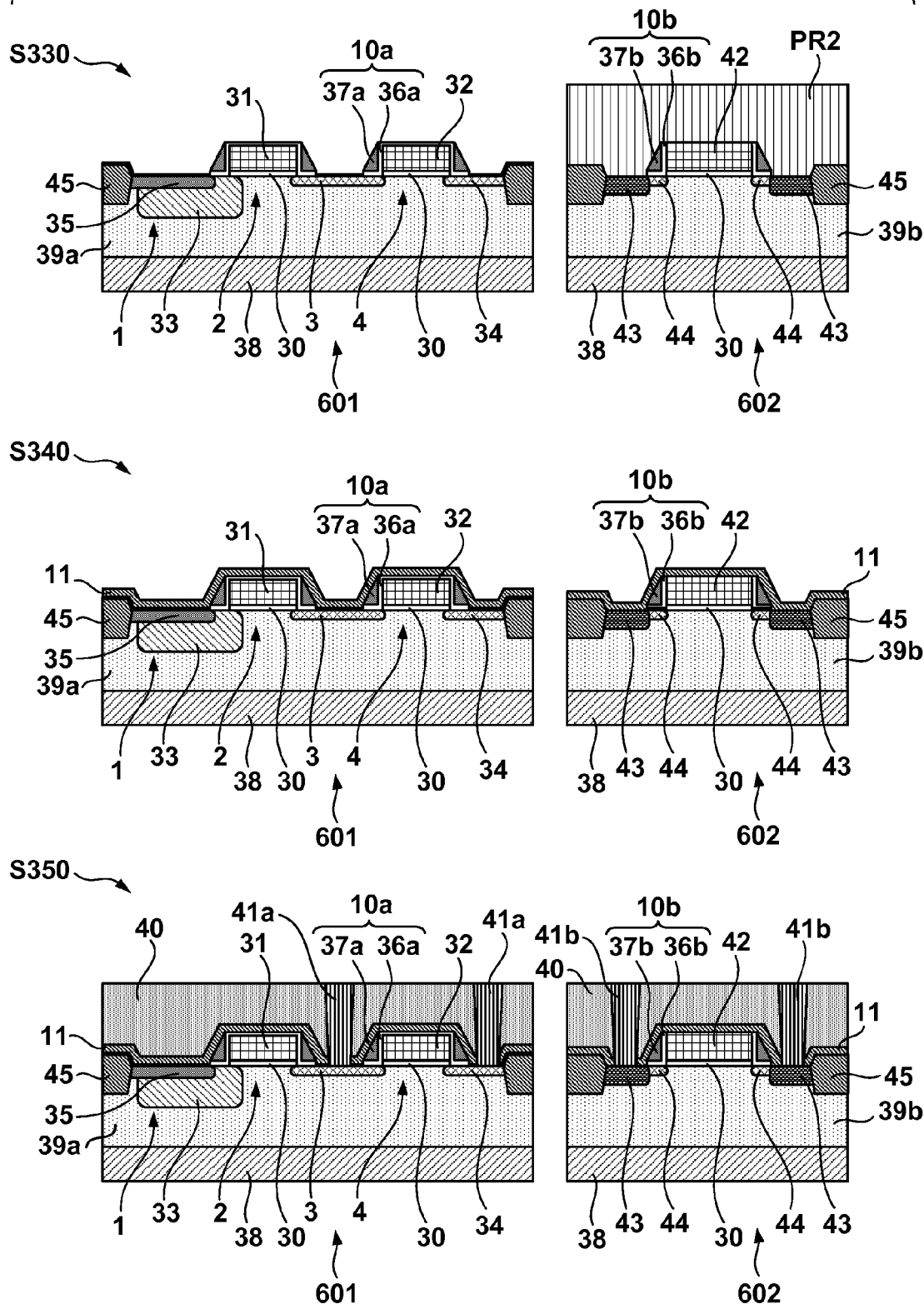
FIG. 4 shows schematic sectional views showing steps of the method of manufacturing the solid-state image sensor in the order of steps according to the first embodiment.

A method of manufacturing the solid-state image sensor IS according to the first embodiment of the present invention will exemplarily be described below with reference to FIGS. 3 and 4. As one example, a description will be made assuming that the first conductivity type is an n type and the second conductivity type is a p type. In step S300, the semiconductor substrate is prepared, and the wells, the element isolation, impurity semiconductor regions, the gate electrodes, and the like are formed. The solid-state image sensor IS can be manufactured by a CMOS manufacturing process.

First, a substrate of the first conductivity type is prepared, and then an epitaxial layer of the first conductivity type is formed on that substrate as the semiconductor region 38 of the first conductivity type. Next, the element isolation 45 is formed in the semiconductor region 38. After that, the well 39a of the second conductivity type is formed in the pixel area 601 and the well 39b of the second conductivity type is formed in the peripheral circuit area 602. The well 39a in the pixel area 601 and the well 39b in the peripheral circuit area 602 can be formed independently to obtain their own target characteristics.

Note that a well of the second conductivity type to form a p-type MOS transistor is also formed in the peripheral circuit area 602, although it is not shown for the sake of simplicity. Also in the following description, formation of the p-type MOS transistor will not be described.

The semiconductor region 33 of the first conductivity type is formed after forming the wells 39a and 39b. Next, an insulating film to form the gate insulating films 30 and a conductive film (for example, polysilicon film) to form the gate electrodes 31, 32, and 42 are formed. Then, the conductive film is patterned, thereby forming the gate electrodes 31, 32, and 42. The insulating film to be the gate insulating films can be patterned together with the conductive film. However, the insulating film to be the gate insulating film may extend from below the gate electrode 31 to cover the photoelectric converter. Note that the thickness of each gate insulating film may differ depending on the type of MOS transistor. For example, the speedup of the peripheral circuit can be achieved by making the gate insulating film of the second MOS transistor thinner than that of the first MOS transistor. Also, an n-type polysilicon electrode may be used for the gate electrode of the n-type MOS transistor and a p-type polysilicon electrode may be used for the gate electrode of the p-type MOS transistor.

The semiconductor region 35 of the second conductivity type to have the buried type photoelectric converter 1 is formed after forming the gate electrodes 31, 32, and 42. Next, the impurity of the first conductivity type is implanted, at the low concentration, into regions (in FIG. 3, the floating diffusion 3 and the semiconductor region 34) where the main electrodes of the first MOS transistor in the pixel area 601 should be formed. As a result, the single drain structure made of the semiconductor region with the low impurity concentration is formed. Furthermore, the impurity of the first conductivity type is implanted, at the low concentration, into regions (the semiconductor regions 44) where the main electrodes of the second MOS transistor (in FIG. 3, the MOS transistor 70) in the peripheral circuit area 602 should be formed. As a result, the semiconductor regions 44 are formed as regions with the low impurity concentration in the LDD structure.

Next, in step S310, a laminated film of the insulating layers 36 and 37 is formed as the insulating film 10 to form the side spacers 10a and 10b. The insulating layer 36 is, for example, an oxide layer such as a silicon oxide layer. The insulating layer 37 is, for example, a nitride layer such as a silicon nitride layer. In this embodiment, the insulating film 10 is formed by the laminated film of the insulating layers 36 and 37. The insulating film 10 may be formed by a single-layer film, however, when the side spacers 10b formed in the peripheral circuit area 602 can satisfy a desired transistor characteristic such as a hot carrier resistance.

Next, in step S320 (first etching step), the side spacer 10b is formed in each side face of the gate electrode 42 of the second MOS transistor. More specifically, first, the entire pixel area 601 is masked with a mask such as a photoresist PR1. Then, in a state in which the pixel area 601 is masked, the insulating film 10 in the peripheral circuit area 602 is etched such that the side spacer 10b is formed, by a part of the insulating film 10, on each side face of the gate electrode 42 of the second MOS transistor. This etching can be performed by dry etching. The side spacers 10b can be formed by the insulating layers 36b and 37b which are parts of the insulating layers 36 and 37, respectively. In the peripheral circuit area 602, the insulating layers 36 and 37 other than the parts to be the side spacers 10b can be removed. Etching in step S320 is preferably performed so as to expose the surface of the semiconductor substrate, that is, the surface of the semiconductor regions 43. In the peripheral circuit area 602, however, the insulating film 10 formed by the insulating layers 36 and 37 may selectively remain to form an element such as a resistive element.

Then, the heavily doped semiconductor regions 43 of the main electrodes (the source and drain) of the second MOS transistor in the peripheral circuit area 602 are formed by ion implantation. After that, an annealing process to activate the semiconductor regions 43 can be performed. The impurity concentration of a portion not covered with the side spacer 10a in each main electrode of the first MOS transistor can be lower than that of a portion not covered with the side spacer 10b in each main electrode of the second MOS transistor. This can be achieved by making a dose when forming the semiconductor regions 43 larger than a dose when forming the floating diffusion 3 and the semiconductor region 34. This makes it possible to reduce the hot carrier of the first MOS transistor.

Next, in step S330 (second etching step), the entire peripheral circuit area 602 is masked with a mask such as a photoresist PR2. In that state, the insulating film 10 in the pixel area 601 is etched. This etching can be performed by dry etching. With this etching, each side spacer 10a can be formed by a part of the insulating film 10. The side spacers 10a are formed by the insulating layers 36a and 37a which are parts of the insulating layers 36 and 37, respectively.

Etching in step S330 is preferably performed so as not to expose the surface of the semiconductor substrate, that is, the surface of the semiconductor region 35. This is because if etching is performed so as to expose the surface of the semiconductor substrate, a white defect or a dark current may increase owing to etching damage. In this embodiment, the insulating layer 36 (silicon oxide layer) is used as an etching stopper to stop etching so as not to expose the surface of the semiconductor substrate. That is, damage to the semiconductor substrate caused by dry etching can be suppressed by leaving the insulating layer 36 (silicon oxide layer) on the photoelectric converter 1. The insulating layer 36 remaining on the photoelectric converter 1 can be removed by wet etching. It is preferable, however, to leave the insulating layer 36.

In this embodiment, each side spacer 10a is formed by the insulating layers 36a and 37a. However, each side spacer 10a may be formed only by the insulating layer 36a by performing etching so as not to leave the insulating film 37a. This etching can be performed by an etching method including the component of isotropic etching so as not to leave the insulating films 37a in each step of the insulating layer 36a. Each side spacer 10a is different from each side spacer 10b used to form the LDD structure and need not be used in any subsequent steps. That is, these side spacers 10a are by-products generated when removing the insulating film 10 from the pixel area 601. Therefore, the etching condition of the insulating film 10 in the pixel area 601 may be adjusted so as not to generate the side spacers 10a. Alternatively, a step of removing the side spacers 10a may be added. However, such a manufacturing process is complicated and may cause extra damage. It is therefore better to process the insulating film 10 under the etching condition to leave the side spacers 10a.

As described above, in the first embodiment, etching (step S320) of the insulating film 10 (insulating layers 36 and 37) in the peripheral circuit area 602, and etching (step S330) of the insulating film 10 (insulating layers 36 and 37) in the pixel area 601 are performed separately. This is advantageous in optimizing the photoelectric converter 1 as the component in the pixel area 601 and the light transmission units (36a, 37a, 11, and 40) positioned on the photoelectric converter 1 as well as optimizing the second MOS transistor as the component in the peripheral circuit area 602.

For example, an arrangement in which while silicon (semiconductor regions 43) is exposed in the peripheral circuit area 602, silicon (photoelectric converter 1) is covered with the insulating layer 36a in the pixel area 601 is advantageous. Therefore, the peripheral circuit area 602 and the pixel area 601 should be optimized separately.

Alternatively, while the LDD structure is formed in the peripheral circuit area 602, the single drain structure can be formed in the pixel area 601. Therefore, also in this case, the peripheral circuit area 602 and the pixel area 601 should be optimized separately.

Next, in step S340, the insulating film 11 is formed to cover the semiconductor substrate on which the gate electrodes 31 and 32 of the first MOS transistor, the gate electrode 42 of the second MOS transistor, and side spacers 10a and 10b have been formed. The insulating film 11 can have an intermediate refractive index between silicon as the material of the semiconductor substrate and silicon oxide as the material of the interlayer insulating film 40. The insulating film 11 can be, for example, the nitride film (for example, the silicon nitride film or the silicon oxynitride film). The insulating film 11 can have a thickness, for example, within a range of 20 nm to 80 nm, typically a 50-nm thickness.

The insulating film 11 can be formed such that a distance of the pixel from the photoelectric converter becomes 50 nm or less. If the insulating film 11 is provided in a range of 50 nm or less from the surface of the semiconductor substrate, the transmittance of visible light (whose wavelength is 400 to 800 nm) can be increased sufficiently regardless of the layer arrangement between the insulating film 11 and the photoelectric converter. The insulating film 11 is preferably formed such that the distance of the pixel from the photoelectric converter becomes 20 nm or less. For example, if the thickness of each insulating layer 36a remaining on the photoelectric converter 1 is about 10 nm, an antireflection effect by the insulating film 11 formed on it is hardly hindered. The insulating layers 36a can also remain on the floating diffusion 3 and the main electrodes of the first MOS transistor such as the reset MOS transistor 4. If the thickness of each of these insulating layers 36a is about 10 nm, the insulating film 11 can effectively be used as the etching stopper when forming the contact holes.

The insulating film 11 can be used as the etching stopper when forming the contact holes in the interlayer insulating film 40 in the pixel area 601 and the interlayer insulating film 40 in the peripheral circuit area 602. In addition, the insulating film 11 is the dielectric film that can function as the antireflection film on the photoelectric converter 1. In this embodiment, steps on the surface of the insulating film 11 are merely steps formed by the gate electrodes 31, 32, and 42 and the element isolation 45.

Next, the interlayer insulating film 40 is formed on the insulating film 11. The interlayer insulating film 40 can be, for example, an NSG film, a BPSG film, or an HDP-SiO film. However, the interlayer insulating film 40 may be another film. The surface of the interlayer insulating film 40 can be planarized by a planarizing process such as a CMP process. An amount that should be polished in the CMP process depends on the steps on the surface of the interlayer insulating film 40 before the CMP process. The polishing amount in the CMP process for eliminating the steps needs to be increased as the steps become larger. As the polishing amount increases, in-plane variations of the polishing amount increases accordingly. The thickness of the interlayer insulating film 40 after the CMP process is set to be thick enough to be managed with stability in consideration of the in-plane variations of the polishing amount. Therefore, as the step immediately before the CMP process is smaller, it is possible to control the interlayer insulating film 40 finally obtained after the CMP process to be thin. This makes it possible to increase the sensitivity or f-number proportionality.

In this embodiment, the CMP process has been exemplified as the planarizing process. However, another planarizing process may be employed. After the planarizing process, the contact holes are formed in the interlayer insulating film 40 in the pixel area 601 and in the interlayer insulating film 40 in the peripheral circuit area 602. When etching is performed to form the contact holes, the insulating film 11 serving as the etching stopper can temporarily stop etching. This makes it possible to prevent the element isolation 45 from being etched excessively even when there is an alignment error of the contact holes and some contact holes lie on the element isolation 45.

The formation step of the contact holes includes the first stage and the second stage. In the first stage, the interlayer insulating film 40 is partially etched using the insulating film 11 as the etching stopper, thereby forming an opening as a part of each contact hole. In the second stage, each contact hole is completed by etching the insulating film 11 via the opening.

Then, the contact plugs 41a and 41b are formed by burying the contact holes with electrically conductive members such as tungsten. Next, the wiring structure 50, the color filter 52, and the microlens 54 can be formed.

Figure 5:
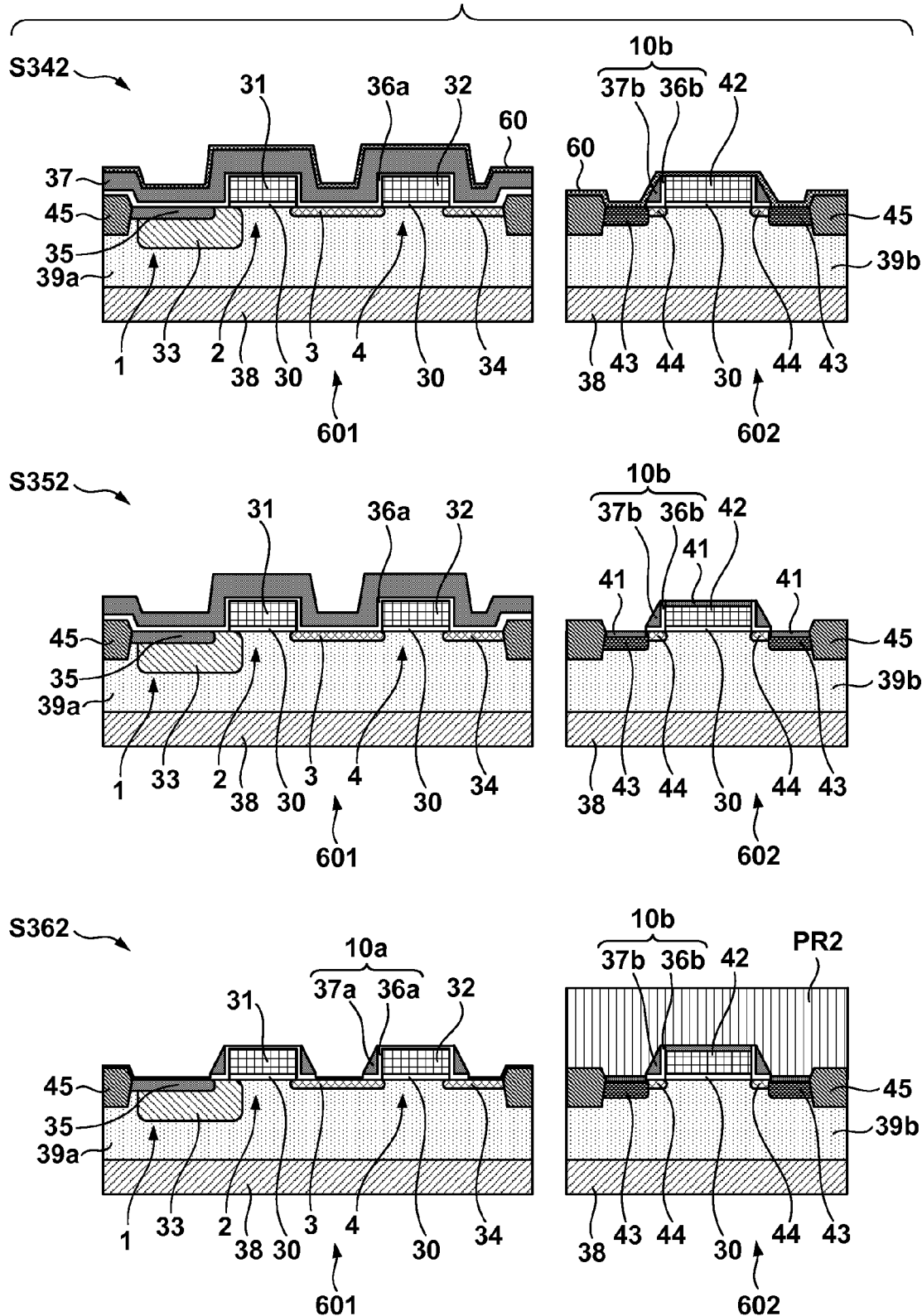
FIG. 5 shows schematic sectional views of steps of a method of manufacturing a solid-state image sensor in the order of steps according to the second embodiment.
Figure 6:
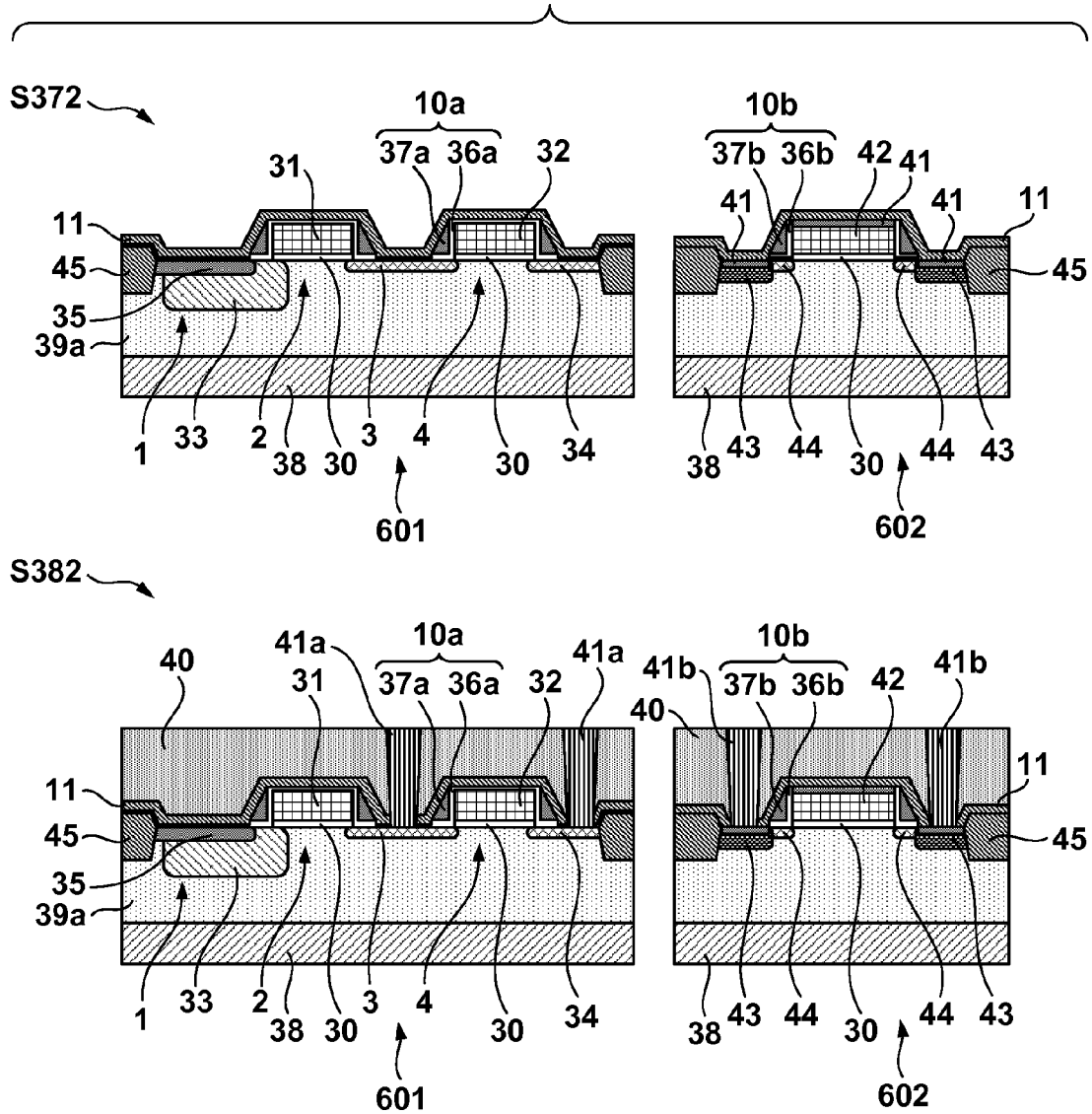
FIG. 6 shows schematic sectional views of steps of the method of manufacturing the solid-state image sensor in the order of steps according to the second embodiment.

A method of manufacturing a solid-state image sensor IS according to the second embodiment of the present invention will exemplarily be described below with reference to FIGS. 5 and 6. In the second embodiment, the second MOS transistor in a peripheral circuit area 602 is formed by a silicide layer (metal semiconductor compound layer). More specifically, in the second embodiment, at least parts of the surfaces of the main electrodes and the gate electrode of the second MOS transistor are formed by the silicide layer. Note that the silicide layer is not formed in the first MOS transistor in a pixel area 601.

The manufacturing method according to the second embodiment includes steps in the same method as in steps S300, S310, and S320 according to the first embodiment, but steps thereafter are different from those in the first embodiment. First, on a substrate which has undergone steps S300, S310, and S320 according to the first embodiment, the entire pixel area 601 is covered with an insulating layer 37 (silicon oxide layer), and side spacers 10b are formed by an insulating layer 36 and the insulating layer 37 in the peripheral circuit area 602. Further, the substrate includes semiconductor regions 43 and 44 which form the main electrodes (the source and drain) in the peripheral circuit area 602.

In step S342 performed after step S320, a refractory metal film 60 is formed to cover the entire substrate. The refractory metal film 60 is, for example, a cobalt film and can be formed by, for example, a PVD method. An anti-oxidant film (not shown) made of titanium nitride or the like can be formed on the refractory metal film 60 to prevent oxidation of the refractory metal film 60. The refractory metal film 60 is formed on the insulating layer 37 on the pixel area 601 so as not to form the silicide layer in the pixel area 601. The insulating layer 37 functions as a protective film which protects silicon (well 39a (including semiconductor regions formed in the well 39a) in the pixel area 601.

Note that another protective film which covers the pixel area 601 may be formed in place of the insulating layer 37 or on the insulating layer 37. In this case, however, the main electrodes (semiconductor regions 44) in the peripheral circuit area 602 may suffer from etching damage because the other protective film is patterned. It is therefore preferable, as described above, to use the insulating layer 37 as the protective film for silicon in the pixel area 601. This makes it possible to form the main electrodes in the peripheral circuit area 602 with stability. This also makes it possible to suppress junction leakage in the boundary between an element isolation 45 and an active region (a region where the main electrodes are formed).

After forming the refractory metal film 60, the first annealing process is performed and in the peripheral circuit area 602, the metal semiconductor compound layers, that is, silicide layers 41 are formed in contact portions between the refractory metal film 60 and silicon (the semiconductor regions 43 and the gate electrode 42). Note that if the refractory metal film 60 is a cobalt film, cobalt monosilicide (CoSi) is formed by the first annealing process. By using other materials as the refractory metal film 60, a silicide layer made of various materials can be formed. The element isolation 45 and a resistive element that should not form the metal semiconductor compound layer in the peripheral circuit area 602 can be covered with a protective film (not shown) in advance.

Then, the unreacted refractory metal film 60 can be removed by a sulfuric acid-peroxide mixture or the like. After that, cobalt monosilicide (CoSi) changes to cobalt disilicide ($CoSi_2$) by performing the higher-temperature second annealing process than the first annealing process by which cobalt monosilicide has been formed.

Subsequent steps S362 (second etching step), S372, and S382 are the same as steps S360 (second etching step), 5370, and S380 according to the first embodiment. Note that step S362 (second etching step) is preferably performed after steps (S342 and S352) for forming the silicide layers 41. This is because if the silicide layers 41 are formed after step S362 (second etching step), for example, it is necessary to form an extra protective film which prevents silicidation of silicon components 1, 3, 34, 31, and 32 in the pixel area 601.

In the second embodiment, while the silicide layers are formed in the peripheral circuit area 602, no silicide layer is formed in the pixel area 601. Therefore, also in this case, the peripheral circuit area 602 and the pixel area 601 should be optimized separately. This is because while the surface of the semiconductor substrate needs to be exposed to form the silicide layers in the peripheral circuit area 602, it is preferable in the pixel area 601 not to expose the surface of the semiconductor substrate to suppress damage to the semiconductor substrate.

As an application of the solid-state image sensor IS according to the above-described embodiments, a camera in which the solid-state image sensor is assembled will exemplarily be described below. The concept of the camera includes not only an apparatus mainly aiming at image capturing but also an apparatus (for example, a personal computer or a portable terminal) accessorily having an image capturing function. The camera includes the solid-state image sensor according to the present invention exemplified as the above-described embodiments, and a processing unit which processes a signal output from the solid-state image sensor. The processing unit can include, for example, an AD converter and a processor which processes digital data output from the AD converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-098891, filed May 12, 2014, which is hereby incorporated by reference herein in its entirety.

What is claimed is:

1. A method of manufacturing a solid-state image sensor which includes a pixel area where a plurality of pixels are arrayed and a peripheral circuit area where a circuit configured to read out a signal from the pixel area is arranged, the pixel area including a first MOS transistor, and the peripheral circuit area including a second MOS transistor, the method comprising:
   a step of forming a gate electrode of the first MOS transistor and a gate electrode of the second MOS transistor on a semiconductor substrate;
   a step of forming a first insulating film to cover the semiconductor substrate on which the gate electrode of the first MOS transistor and the gate electrode of the second MOS transistor have been formed;
   a first etching step of etching the first insulating film in the peripheral circuit area in a state in which the pixel area is masked so as to form a side spacer on a side face of the gate electrode of the second MOS transistor from a part of the first insulating film;
   a second etching step of etching the first insulating film in the pixel area in a state in which the peripheral circuit area is masked; and
   a step of forming, after the first etching step and the second etching step, the second insulating film to cover the semiconductor substrate on which the gate electrode of the first MOS transistor, the gate electrode of the second MOS transistor, and the side spacers have been formed.

2. The method according to claim 1, wherein the second etching step is performed after the first etching step, and the method further comprises, between the first etching step and the second etching step,
   a step of implanting an impurity for forming a source and drain of the second MOS transistor in the peripheral circuit area, and
   a step of forming a silicide layer in the second MOS transistor after implanting the impurity.

3. The method according to claim 1, further comprising:
   a step of forming an interlayer insulating film to cover the second insulating film; and
   a step of forming an opening in the interlayer insulating film by partially etching the interlayer insulating film using the second insulating film as an etching stopper, and
   further forming a contact hole in the interlayer insulating film and the second insulating film by etching the second insulating film via the opening.

4. The method according to claim 1, wherein the first MOS transistor is a transistor including semiconductor regions of a photoelectric converter as main electrodes, and
   the second etching step is performed to form, by the part of the first insulating film, a side spacer on a side face of the gate electrode of the first MOS transistor on a side of the semiconductor region.

5. The method according to claim 1, wherein the first insulating film includes a first insulating layer and a second insulating layer, and in the second etching step, the second insulating layer is etched using the first insulating layer as an etching stopper.

6. The method according to claim 1, wherein the second insulating film contains a nitride.

7. The method according to claim 1, wherein the second insulating film has a thickness within a range of 20 nm to 80 nm, and/or
the second insulating film is configured to function as an antireflection film on a photoelectric converter of each of the pixels.

8. The method according to claim 1, wherein the second insulating film is formed such that a distance from a photoelectric converter of each of the pixels is not more than 50 nm.

9. The method according to claim 1, wherein a silicon nitride film is not formed on the semiconductor substrate between the step of forming the first insulating film and the step of forming the second insulating film.

10. A solid-state image sensor which includes a pixel area where a plurality of pixels are arrayed and a peripheral circuit area where a circuit configured to read out a signal from the pixel area is arranged, the pixel area including a first MOS transistor, and the peripheral circuit area including a second MOS transistor, the sensor comprising:
a first film containing a nitride which covers each gate electrode of the first MOS transistor and the second MOS transistor arranged on a semiconductor substrate, and the semiconductor substrate;
a second film which covers the first film;
contact plugs connected to main electrodes of the first MOS transistor via contact holes provided in the first film and the second film, respectively; and
contact plugs connected to main electrodes of the second MOS transistor via contact holes provided in the first film and the second film, respectively,
wherein a nitride film is not included between the first film and an upper face of the gate electrode of the first MOS transistor.

11. The sensor according to claim 10, further comprising a silicide layer provided in at least a portion of the second MOS transistor and covered with the first film.

12. The sensor according to claim 10, further comprising a side spacer provided on a side face of the gate electrode of the first MOS transistor and the gate electrode of the second MOS transistor,
wherein an impurity concentration of a portion not covered with the side spacer in at least one of the main electrodes of the first MOS transistor is lower than an impurity concentration of a portion not covered with the side spacer in at least one of the main electrodes of the second MOS transistor.

13. The sensor according to claim 10, wherein the first film is configured to function as an antireflection film on a photoelectric converter of each of the pixels, and/or
the first film has a thickness within a range of 20 nm to 80 nm.

14. The sensor according to claim 10, wherein a distance between the semiconductor substrate and the first film is not more than 50 nm.

15. A camera comprising;
a solid-state image sensor defined in claim 10; and
a processing unit configured to process a signal output from the solid-state image sensor.

16. A solid-state image sensor which includes a pixel area where a plurality of pixels are arrayed and a peripheral circuit area where a circuit configured to read out a signal from the pixel area is arranged, the pixel area including a first MOS transistor, and the peripheral circuit area including a second MOS transistor, the sensor comprising:
a first film containing a nitride which covers each gate electrode of the first MOS transistor and the second MOS transistor arranged on a semiconductor substrate, and the semiconductor substrate;
a second film which covers the first film;
contact plugs connected to main electrodes of the first MOS transistor via contact holes provided in the first film and the second film, respectively; and
contact plugs connected to main electrodes of the second MOS transistor via contact holes provided in the first film and the second film, respectively,
wherein out of the first film, a nitrogen concentration between a portion along a surface of the semiconductor substrate and a photoelectric converter of each of the pixels is 10 atm % or less.

17. The sensor according to claim 16, wherein the first MOS transistor is a transfer transistor including semiconductor regions of the photoelectric converter as main electrodes,
the sensor further comprises a side spacer provided on each side face of the gate electrode of the first MOS transistor on a side of the semiconductor region, and the first film covers the side spacers.

18. The sensor according to claim 16, wherein the first film is configured to function as an antireflection film on the photoelectric converter of each of the pixels, and/or
the first film has a thickness within a range of 20 nm to 80 nm.

19. The sensor according to claim 16, wherein a distance between the semiconductor substrate and the first film is not more than 50 nm.

20. A camera comprising;
a solid-state image sensor defined in claim 16; and
a processing unit configured to process a signal output from the solid-state image sensor.

* * * * *